(12) United States Patent
Cripe

(10) Patent No.: US 7,355,397 B2
(45) Date of Patent: Apr. 8, 2008

(54) MAGENTOMETER CIRCUIT

(75) Inventor: David W. Cripe, Williamsburg, VA (US)

(73) Assignee: Continential Automotive Systems US, Inc., Auburn Hills ( * ) Notice: Subject to any disclaimer, the term of this patent is extended or adjusted under 35 U.S.C. 154(b) by 374 days.

(21) Appl. No.: 11/284,249

(22) Filed: Nov. 21, 2005

(65) Prior Publication Data
US 2007/0114995 A1    May 24, 2007

(51) Int. Cl.
*G01R 33/04* (2006.01)
(52) U.S. Cl. .................................................. 324/253
(58) Field of Classification Search ............... 324/244, 324/249, 252–260; 73/862.321, 862.331, 73/863.333; 33/361
See application file for complete search history.

(56) References Cited

U.S. PATENT DOCUMENTS

| | | | |
|---|---|---|---|
| 5,351,555 A | 10/1994 | Garshelis | |
| 5,696,575 A | 12/1997 | Kohnen et al. | |
| 5,889,215 A | 3/1999 | Kilmartin et al. | |
| 5,939,881 A | 8/1999 | Slater et al. | |
| 6,145,387 A | 11/2000 | Garshelis | |
| 6,222,363 B1 | 4/2001 | Cripe | |
| 6,298,467 B1 | 10/2001 | Chuang et al. | |
| 6,300,855 B1 | 10/2001 | Clark et al. | |
| 6,346,812 B1 | 2/2002 | May et al. | |
| 6,516,508 B1 | 2/2003 | Gandarillas | |
| 6,553,847 B2 | 4/2003 | Garshelis | |
| 6,698,299 B2 | 3/2004 | Cripe | |
| 2002/0162403 A1 | 11/2002 | Cripe | |

*Primary Examiner*—Bot LeDynh

(57) ABSTRACT

A fluxgate magnetometer drive circuit includes a fluxgate inductor that is driven through magnetic saturation by altering voltage pulses. Following each drive pulse, the spurred magnetic energy in the fluxgate is allowed to dissipate by connecting a fluxgate across a fixed reverse voltage. The time for the fluxgate current to decay to zero is measured and is indicative of a magnetic field induced in the torque transducer.

17 Claims, 2 Drawing Sheets

MAGENTOMETER CIRCUIT

BACKGROUND OF THE INVENTION

This invention is generally related to a fluxgate magnetometer for detecting an external magnetic field. More particularly, this invention is directed toward a circuit for driving and controlling a flux gate magnetometer device.

Non-contact torque sensors utilize a magnetoelastic material affixed to a torque transducer. Application of torque to the torque transducer generates a magnetic field that is detected and converted to a usable electric signal by a magnetometer. Current magnetometers utilize fluxgates to detect and convert the generated magnetic field into a usable electric signal proportional to the applied torque.

Typically, a fluxgate magnetometer operates by observing magnetically induced changes of impedance of a fluxgate inductor. The fluxgate inductor is driven to magnetic saturation by an alternating current while observing an output voltage.

Disadvantageously, the resulting output voltage is not necessarily a direct liner relationship with the magnetic field produced by the torque sensor. Further, temperature fluctuations can cause undesirable fluctuations in signals indicative of an applied force.

Accordingly, it is desirable to develop and design a fluxgate magnetometer circuit that provide a stable, proportional, and temperature independent method and device for measuring changes in magnetic field.

SUMMARY OF THE INVENTION

An example magnetometer according to this invention includes at least one magnetically saturatable inductor that is driven by a circuit that energizes the conductor such that it becomes magnetically saturated and once magnetically saturated removes any drive current to allow the inductor to drain.

The drive circuit according to this invention magnetically saturates the inductor and once the inductor is magnetically saturated, removes the drive current to allow the drain of current from each of the inductors. The duration in which the inductor drains current is then measured and is used to determine the amplitude and magnitude of force applied to the torque transducer.

The magnetometer circuit according to this invention is used along with a torque sensor including and utilizing a magnetoelastic material. The magnetoelastic material produces a magnetic field responsive to an applied force or torque. The magnetic field produced by the magnetoelastic material impinges on the saturatable inductor. The impinging magnet field causes a change in the duration of time in which current drains from each inductor. Measuring the change in the duration of time in which the inductor drains current provides an accurate stable and temperature independent measurement of the impinging magnetic field. With this accurate and stable measurement of the magnetic field, an accurate and substantially linear relationship can be determined to provide accurate, reliable force measurements.

Accordingly, the flux gate magnetometer circuit according to this invention provides a stable proportional and temperature independent method and device for measuring changes in a magnetic field and thus the force applied to an accompanying force transducer.

These and other features of the present invention can be best understood from the following specification and drawings, the following of which is a brief description.

DETAILED DESCRIPTION OF THE PREFERRED EMBODIMENT

Figure 1:
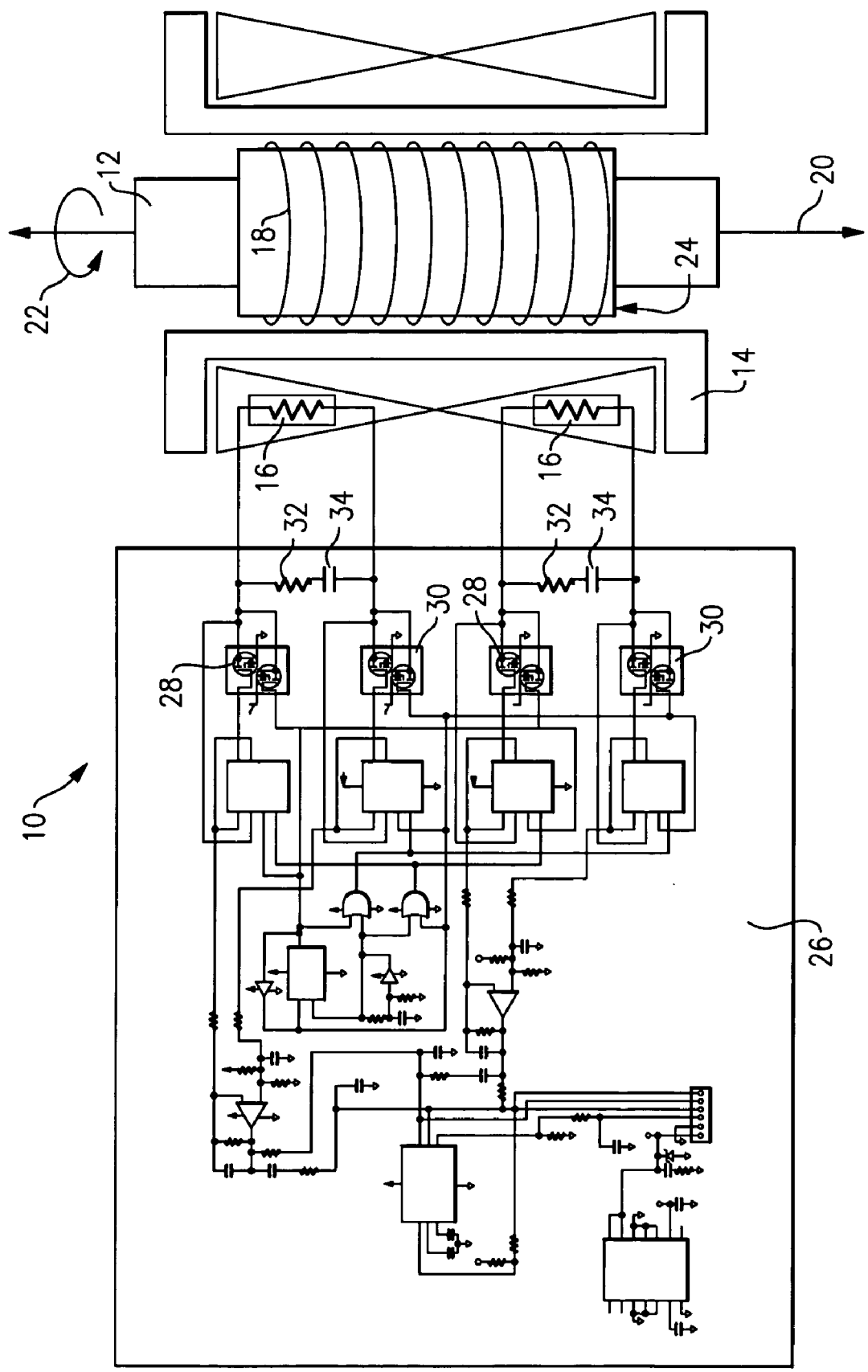
FIG. 1 is a schematic illustration of a force-sensing device according to this invention.

Referring to FIG. 1, a torque sensor assembly 10 is schematically shown and includes a torque transducer 12 disposed within a coil 14. The torque transducer 12 includes a ring of magnetoelastic material 18. The ring 18 of magnetoelastic material generates a magnetic field schematically shown at 24 in response to the application of torque schematically indicated at 22 about axis 20. The magnetic field 24 created by the application of torque 22 impinges upon fluxgate inductors 16. The fluxgate inductors 16 are in turn driven by a drive circuit 26. The drive circuit 26 provides for energization of the coil 14 to create an alternating magnetic field that magnetically saturates each of the inductors 16.

A voltage source provided by the circuit 26 is connected across the inductor 16. The connection of the voltage source connected across the inductors 16 is a proportional applied voltage that is inversely proportional to the inductance of the inductors 16. At a point at which a current induced within the inductors 16 is sufficiently saturated to the core, the permeability of each of the fluxgate inductors 16 drops towards unity. This drop consequently provides the drop in the inductance of the inductors 16 as well. At the point of magnetic saturation, current ramps up increasingly due to the reduced impedance at the inductor 16.

Once the inductor 16 is magnetically saturated the circuit 26 reverses current to the conductor 16. This provides for the rapid drop in current from the inductor 16. The saturated core and dropping current result in an abrupt increase in an initial non-saturated current value. Then the inductor 16 current ramps down linearly as the stored energy in the inductor 16 is returned to the voltage source. Because the saturation of the inductor 16 is affected by the magnetic field 24 produced by the torque transducer 12, a time between the initial high current value and the reduction to zero current is used to measure the magnitude and direction of the magnetic field 24, and thus the magnitude and direction of the applied force 22.

The circuit 26 drives the inductor 16 by way complementary N and P channel MOSFETS 28, 30. The circuit includes a first P channel MOSFET 28 and a second N channel MOSFET 30. Each of the fluxgate inductor 16 includes a P channel MOSFET 28 and an N channel MOSFET 30. Also disposed parallel to the inductor 16 are capacitor 34 and resistor 32.

During operation the P channel MOSFET 28 is driven to an on state while the N channel MOSFET 30 is also driven to an on state. The on states of both of the MOSFETs 28, 30 places a desired voltage across each of the inductors 16. After the inductor 16 is completely and magnetically saturated both the N channel MOSFET 30 and the P channel MOSFET 28 are driven to an off position. While the N channel MOSFET is switched off and the P channel device MOSFET 28 is switched on, the stored energy in the fluxgate results in a current flow through the body diode of the N channel MOSFET 30. The P channel MOSFET 28 also experiences such a current flow. This places a negative voltage across each of the inductors 16. This negative current flow causes a current to ramp toward a zero value. As the inductor 16 current crosses a zero value and begins to flow in reverse, the body diode of the N channel MOSFET 30 recovers and includes a high impedance. At this instance, the voltage of the drain to the end channel MOSFET 30 begin to rise towards the desired voltage. The signal is then used to toggle a flip-flop device that controls the drive of the N channel MOSFET to turn it on. This, in essence, turns on both the N channel MOSFET 30 and the P channel MOSFET 28 to renew the cycle of saturation and draining of each of the fluxgate inductors 16.

Figure 2:
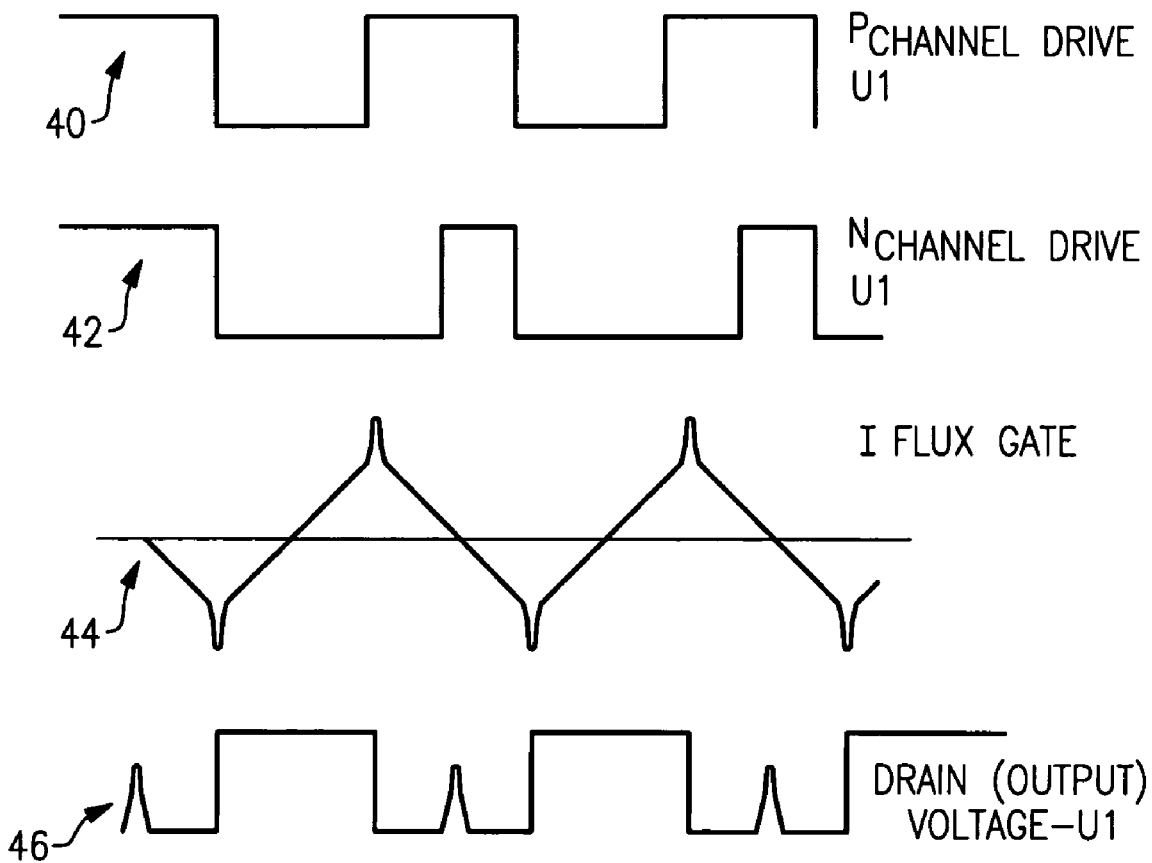
FIG. 2 is a schematic representation of current outputs during operation of the torque of the force sensor according to this invention.

Referring to FIG. 2, this alternating and periodic wave form is illustrated schematically by a current value emitted by the P channel MOSFET as illustrated at 40 in view of the current values driven by the N channel MOSFET at 42. These are also shown in reference to current at the inductors 16 as indicated at 44 and the current drain voltage that is output from the MOSFETs as is indicated at 46.

The presence of the magnetic field 24 results in an asymmetrical saturation of each of the inductors 16. This asymmetrical saturation causes a different pulse within the N channel MOSFET 30. By low pass filtering and amplifying to the differential voltage between these drive signals, a signal related to the incident magnetic field 24 at the fluxgate inductor 16 is formed. If the supply voltage is used as a reference for an analog to digital converter processing, the magnetometer output voltage, the system is immune from errors resulting from a precision or drift in the supply voltage.

Accordingly, a drive circuit for a magnetometer according to this invention provides for the accurate measurement of a magnetic field that is independent, temperature stable and substantially linear providing for an increased accuracy in the measurement of an applied force.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A magnetometer circuit assembly for driving a fluxgate comprising:
    a magnetically saturatable inductor; and
        a circuit to drive the inductor to magnetic saturation and once saturated, decouple the drive circuit and drain energy from the inductor, wherein the circuit measures a duration required for energy in the inductor to drain to zero.

2. The assembly as recited in claim 1, wherein the duration for energy in the inductor to drain to zero changes responsive to exposure of the inductor to an external magnetic field.

3. The assembly as recited in claim 2, wherein the duration for energy to drain to zero is indicative of a magnitude of the external magnetic field.

4. The assembly as recited in claim 1, wherein said circuit includes a P channel MOSFET and an N channel MOSFET.

5. The assembly as recited in claim 4, including a resistor and capacitor disposed in parallel to the inductor.

6. The assembly as recited in claim 1, including a first inductor and a second inductor.

7. The assembly as recited in claim 1, including a torque transducer having a magnetoelastic material that generates a magnetic field responsive to application of a force.

8. The assembly as recited in claim 7, wherein the magnetic field generated by the magnetoelastic material is proportional to a force applied to the torque transducer.

9. A method of operating a fluxgate magnetometer drive circuit comprising the steps of:
    a) magnetically saturating a magnetically saturatable inductor with a drive current;
    b) removing the drive current responsive to saturation of the inductor;
    c) draining stored current from the inductor; and
    d) measuring a duration in which the fluxgate takes to drain to a zero current level.

10. The method as recited in claim 9, wherein the duration in which the fluxgate takes to drain to the zero current is related to the magnitude of an externally generated magnetic field.

11. The method as recited in claim 10, wherein the externally generated magnetic field is generated responsive to an application of force.

12. The method as recited in claim 11, including the step of generating the externally magnetic field with a magnetoelastic material responsive to an applied force.

13. The method as recited in claim 12, including the step of ramping up current responsive to the current attaining the zero current to repeat magnetic saturation of the inductors.

14. The method as recited in claim 13, wherein the present of the externally generated magnetic field causes an asymmetry in saturation current in the inductors that in turn causes a difference in the duration that it takes for the current to reach the zero current value.

15. A force sensor assembly comprising:
    a transducer including a magnetoelastic material that generates a magnetic field responsive to an applied force;
    a magnetically saturatable inductor; and
    a circuit to drive the inductor to magnetic saturation and once saturated, decouple the drive circuit and drain energy from the inductor, wherein the circuit measures a duration for energy in the inductor to drain to zero, and the measured duration is indicative of the magnitude of the applied force.

16. The assembly as recited in claim 15, wherein the magnetic field generated by the magnetoelastic material is impressed on the inductor and affects the measured duration.

17. The assembly as recited in claim 16, wherein the circuit includes a resistor and capacitor disposed in parallel to said inductor.

* * * * *